US011114590B2

(12) United States Patent
Hsu et al.

(10) Patent No.: US 11,114,590 B2
(45) Date of Patent: Sep. 7, 2021

(54) WAVELENGTH CONVERSION MODULE, METHOD OF FORMING THE SAME AND PROJECTION APPARATUS

(71) Applicant: Coretronic Corporation, Hsin-Chu (TW)

(72) Inventors: Pi-Tsung Hsu, Hsin-Chu (TW); Chi-Tang Hsieh, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 109 days.

(21) Appl. No.: 16/656,580

(22) Filed: Oct. 18, 2019

(65) Prior Publication Data

US 2020/0127172 A1 Apr. 23, 2020

(30) Foreign Application Priority Data

Oct. 22, 2018 (CN) .......................... 201811226956.8

(51) Int. Cl.
*H01L 33/50* (2010.01)

(52) U.S. Cl.
CPC .......... *H01L 33/502* (2013.01); *H01L 33/505* (2013.01); *H01L 33/508* (2013.01); *H01L 2933/0041* (2013.01)

(58) Field of Classification Search
CPC ... H01L 33/502; H01L 33/505; H01L 33/508; H01L 2933/0041
See application file for complete search history.

(56) References Cited

U.S. PATENT DOCUMENTS

| 9,972,751 B2 | 5/2018 | Saka et al. |
| 2013/0043786 A1* | 2/2013 | Hsieh .................. B32B 5/16 313/506 |

(Continued)

FOREIGN PATENT DOCUMENTS

| CN | 104121493 | 10/2014 |
| CN | 104595852 | 5/2015 |

(Continued)

OTHER PUBLICATIONS

"Search Report of Europe Counterpart Application", dated Feb. 19, 2020, p. 1-p. 7.

(Continued)

*Primary Examiner* — Marc Anthony Armand
(74) *Attorney, Agent, or Firm* — JCIPRNET

(57) ABSTRACT

A wavelength conversion module, a method of forming the same and a projection apparatus are provided. The wavelength conversion module includes a substrate and a wavelength conversion layer. The substrate has a rough surface including two first regions and a second region located between the two first regions in a radial direction on the substrate. The wavelength conversion layer is located on the substrate and includes a wavelength conversion material, a bonding material and diffuse reflection particles. The wavelength conversion material is distributed in the bonding material. The diffuse reflection particles are located on the rough surface of the substrate and between the wavelength conversion material and the substrate. A second density of the diffuse reflection particles in the second region is greater than a first density of the same in one of the two first regions.

24 Claims, 13 Drawing Sheets

(56) References Cited

U.S. PATENT DOCUMENTS

| | | | |
|---|---|---|---|
| 2013/0099210 A1 | 4/2013 | Ikeda | |
| 2015/0077966 A1 | 3/2015 | Bessho et al. | |
| 2015/0280065 A1 | 10/2015 | Wada | |
| 2015/0346579 A1 | 12/2015 | Hsieh et al. | |
| 2016/0351762 A1* | 12/2016 | Sato | H01L 33/54 |
| 2018/0122993 A1* | 5/2018 | Camras | C23C 16/40 |
| 2018/0233633 A1* | 8/2018 | Yamanaka | H01L 33/0054 |

FOREIGN PATENT DOCUMENTS

| | | |
|---|---|---|
| CN | 103912848 | 7/2016 |
| CN | 206819041 | 12/2017 |
| CN | 108139523 | 6/2018 |
| CN | 209103006 | 7/2019 |
| EP | 1667231 | 6/2006 |

OTHER PUBLICATIONS

"Office Action of China Counterpart Application", dated Jun. 3, 2021, p. 1-p. 9.

* cited by examiner

WAVELENGTH CONVERSION MODULE, METHOD OF FORMING THE SAME AND PROJECTION APPARATUS

CROSS-REFERENCE TO RELATED APPLICATION

This application claims the priority benefit of China application serial no. 201811226956.8, filed on Oct. 22, 2018. The entirety of the above-mentioned patent application is hereby incorporated by reference herein and made a part of this specification.

BACKGROUND

Field of the Invention

The invention relates to an optical module, a method of forming the same and an optical apparatus including the optical module. More particularly, the invention relates to a wavelength conversion module, a method of forming the same and a projection apparatus including the wavelength conversion module.

Description of Related Art

Recently, projection devices including solid-state light sources such as light-emitting diodes (LEDs) and/or laser diodes have gradually taken a larger place in the market. Since laser diodes may have a luminous efficiency of about 20% higher than light-emitting diodes, the technique of using laser light sources to excite phosphor for producing pure color light beams has been developed, so that the limitation in luminous efficiency of the light-emitting diodes may be broken.

However, the conventional manufacture method for a reflective layer on a phosphor wheel may generally involve vacuum plating or mixed glue coating. The luminous efficiency, thermal conductivity coefficient, or reliability of the phosphor wheel may be subjected to be compromised due to limitations in manufacturing cost, material selection, thickness of the phosphor wheel.

The information disclosed in this Background section is only for enhancement of understanding of the background of the described technology and therefore it may contain information that does not form the prior art that is already known to a person ordinarily skilled in the art. Further, the information disclosed in the Background section does not mean that one or more problems to be resolved by one or more embodiments of the invention were acknowledged by a person of ordinary skill in the art.

SUMMARY

The invention provides a wavelength conversion module and a projection apparatus which may be used to provide preferable conversion efficiency, reliability or optical quality.

The invention provides a method of forming a wavelength conversion module, and the wavelength conversion module as such formed may have preferable conversion efficiency and reliability.

Other features and advantages of the invention can be further understood by the technical features disclosed in the invention.

In order to achieve one or a portion of or all of the features or other features, an embodiment of the invention provides a wavelength conversion module. The wavelength conversion module includes a substrate and a wavelength conversion layer. The substrate has a rough surface including two first regions and a second region, and the second region is located between the two first regions in a radial direction on the substrate. The wavelength conversion layer is located on the substrate and includes a wavelength conversion material, a bonding material and a plurality of diffuse reflection particles. The wavelength conversion material is distributed in the bonding material. The diffuse reflection particles are located on the rough surface of the substrate and located between the wavelength conversion material and the substrate. A second density of the diffuse reflection particles in the second region is greater than a first density of the diffuse reflection particles in one of the two first regions.

In order to achieve one or a portion of or all of the features or other features, an embodiment of the invention provides a projection apparatus. The projection apparatus includes an abovementioned wavelength conversion module, an excitation light source, a light valve and a projection lens. The excitation light source is configured to emit an excitation light beam, and the excitation light beam may be transmitted to the wavelength conversion module and converted into an illumination beam by the wavelength conversion module. The light valve is located on a transmittance path of the illumination beam and configured to convert the illumination beam to an image beam. The projection lens is located on a transmission path of the image beam and configured to project the image beam.

In order to achieve one or a portion of or all of the features or other features, an embodiment of the invention provides a method of forming a wavelength conversion module. The method includes the following steps. A rough surface is formed on a substrate. The rough surface includes two first regions and a second region, and the second region is located between the two first regions in a radial direction on the substrate. A plurality of diffuse reflection particles is coated on the rough surface of the substrate, and a second concentration percentage by volume of the diffuse reflection particles in the second region is greater than or equal to a first concentration percentage by volume of the diffuse reflection particles in one of two the first regions. A wavelength conversion material and a bonding material are coated on the substrate to form a wavelength conversion layer, and the diffuse reflection particles are located between the wavelength conversion material and the substrate.

Based on the above, the embodiments of the invention achieve at least one of the following advantages or effects. In the embodiments of the invention, various distribution densities of the diffuse reflection particles in different regions on the substrate may be achieved by disposing a rough surface on the substrate of the wavelength conversion module. Due to such-distributed diffuse reflection particles which are used for forming a wavelength conversion layer, a preferable combination of reflectivity, heat resistance, reliability, and manufacture cost of the wavelength conversion layer may be thus achieved. Further, by configuring the surface roughnesses of the two first regions and the second region of the rough surface as required by the wavelength conversion module, the wavelength conversion layer of the wavelength conversion module may have a preferable conversion efficiency and a preferable attachment with the substrate. As such, the reliability of the wavelength conversion module may be improved. On the other hand, in the projection apparatus of the embodiments of the invention, main part of the laser spot may be directed at an area with more diffuse reflection particles and less bonding material.

Thus, the risk of degradation and/or burnout caused from the bonding material which may be less heat-resistive may be avoided. Therefore, a preferable optical quality and reliability may be arrived at. In addition, in the method of forming the wavelength conversion module provided in the embodiments of the invention, various densities of the diffuse reflection particles used for the wavelength conversion layer in different areas of the substrate may be controlled by forming a rough surface on the substrate, such that the wavelength conversion module can have a preferable reliability and conversion efficiency.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
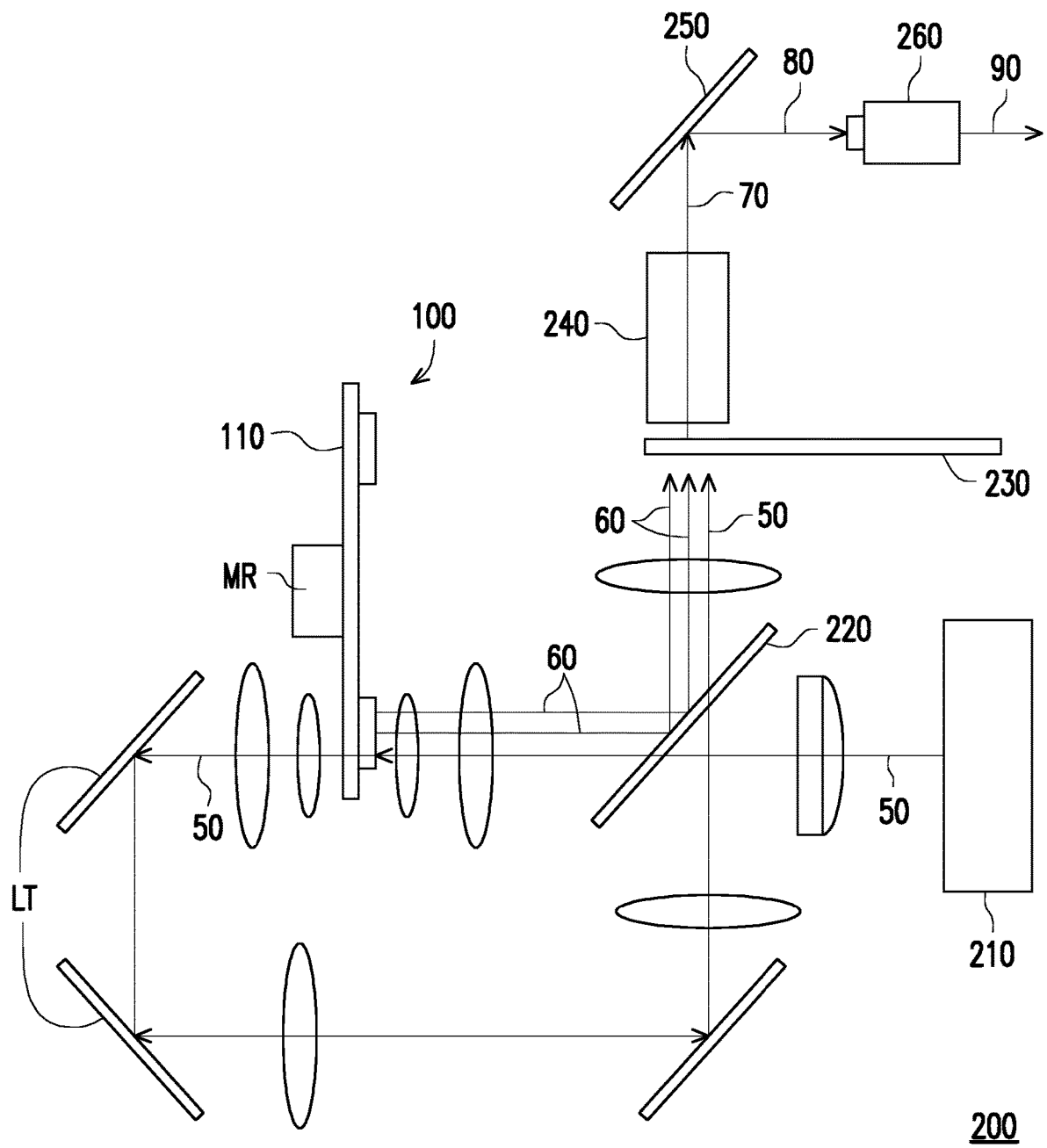
FIG. 1 is a schematic structure view of a projection apparatus according to an embodiment of the invention.

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

There may be two manufacturing methods of a reflective layer of a phosphor wheel. One of the two manufacturing methods involves a vacuum plating where a silver film, an aluminum film, a dielectric medium film or a mixed stack thereof may be plated on a heat dissipation substrate. The other involves processes such as printing, spray-on and dispensing onto a heat dissipation substrate a mixture of diffuse reflection particles with organic or inorganic glue, so as to form a reflective layer. During the manufacturing process, requirements in reflectivity, thermal conductivity and reliability may be achieved with the consideration of the thickness of the reflective layer, the concentration of the diffuse reflection particles and the amount of the glue, which may a low thermal conductivity coefficient, used in the mixture.

Figure 2A:
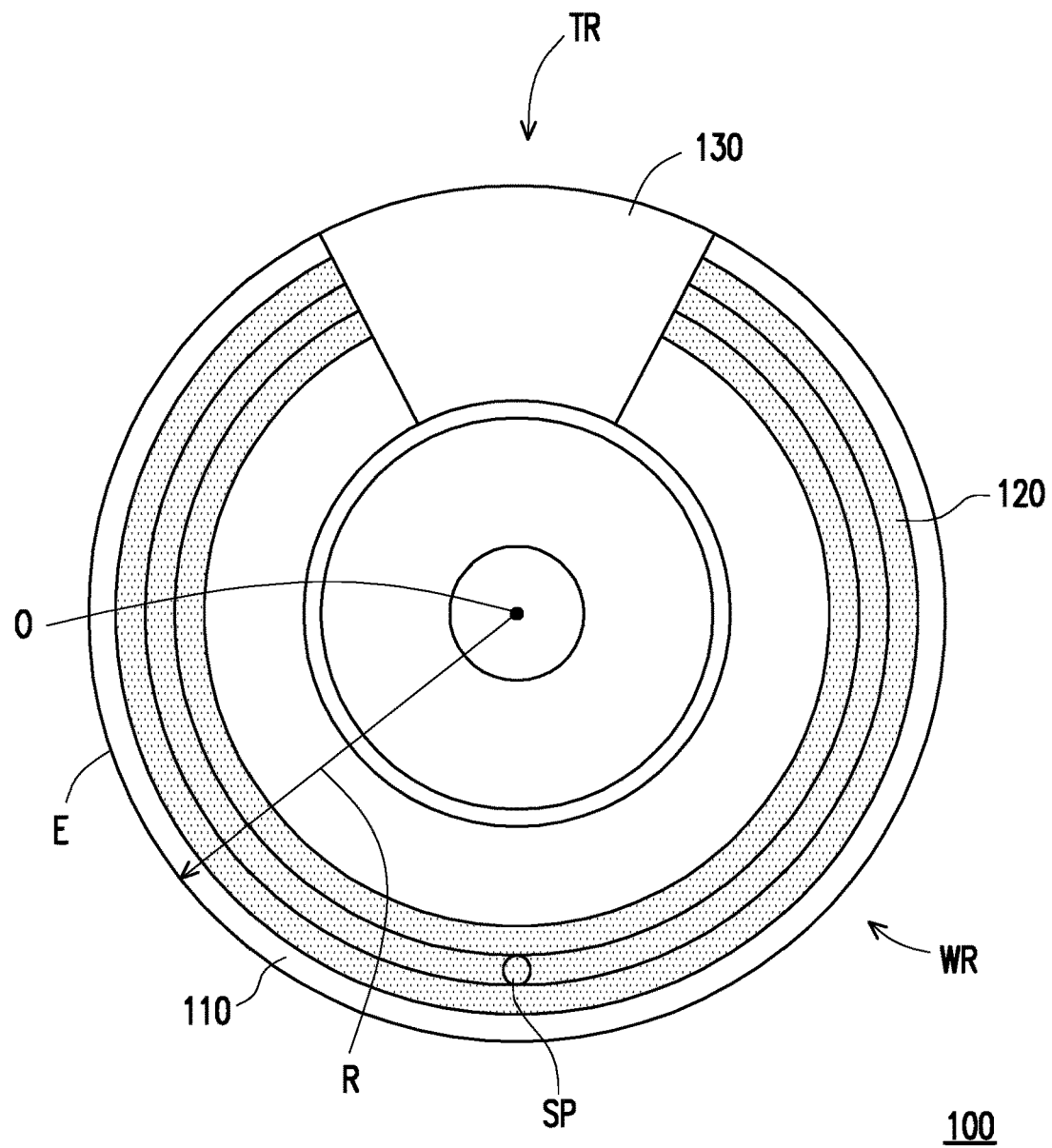
FIG. 2A is a schematic top view of a wavelength conversion module depicted in FIG. 1.
Figure 2B:
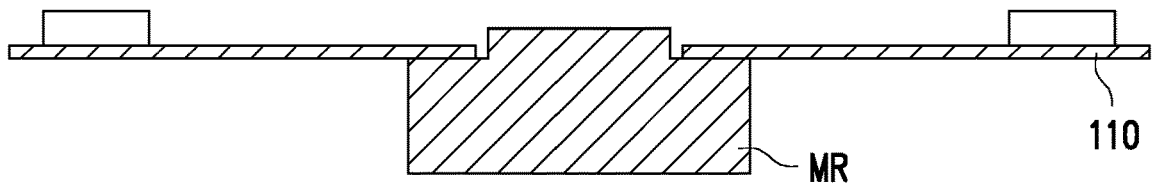
FIG. 2B is a schematic cross-sectional view of the wavelength conversion module depicted in FIG. 2A.
Figure 2C:
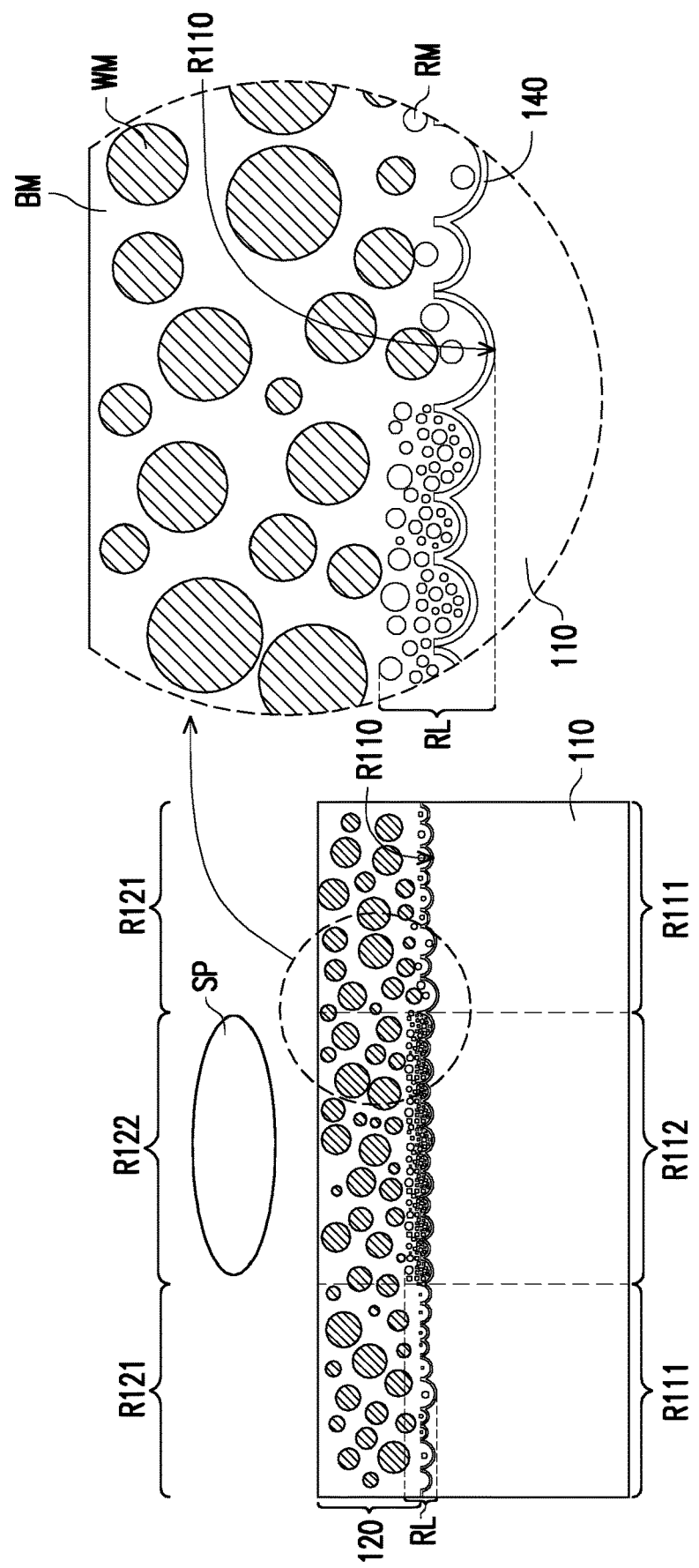
FIG. 2C is a partially enlarged view of the wavelength conversion module depicted in FIG. 2B.

FIG. 1 is a schematic structure view of a projection apparatus according to an embodiment of the invention. FIG. 2A is a schematic top view of a wavelength conversion module depicted in FIG. 1. FIG. 2B is a schematic cross-sectional view of the wavelength conversion module depicted in FIG. 2A. FIG. 2C is a partially enlarged view of the wavelength conversion module depicted in FIG. 2B. Referring to FIG. 1 to FIG. 2C, a projection apparatus 200 includes an excitation light source 210, a dichroic unit 220, a wavelength conversion module 100, a light valve 250 and a projection lens 260. For example, in the embodiment, the light valve 250 is, for example, a digital micro-mirror device (DMD) or a liquid-crystal-on-silicon panel (LCOS panel). However, in other embodiments, the light valve 250 may be a transmissive liquid crystal panel or other light beam modulators.

For instance, referring to FIG. 1, in the embodiment, the excitation light source 210 is configured to emit an excitation light beam 50. In the embodiment, the excitation light source 210 is a laser source, and the excitation light beam 50 is a blue laser beam. For example, the excitation light source 210 may include a plurality of blue laser diodes (not shown) arranged in an array, but the invention is not limited thereto.

Specifically, as illustrated in FIG. 1, in the embodiment, the dichroic unit 220 is disposed on a transmission path of the excitation light beam 50 and located between the excitation light source 210 and the wavelength conversion module 100. Specifically, the dichroic unit 220 may be a dichroic mirror, a partially transmissive and partially reflective component, a polarizing dichroic mirror or other various components capable of dichotomizing the light beam. For example, in the embodiment, the dichroic unit 220 may, for example, allow a light beam with a blue wavelength to penetrate and reflect light beams with other color wavelengths (e.g., red, green, yellow and so on). In other words, the dichroic unit 220 may allow the excitation light beam 50 with a blue wavelength to penetrate, and in this way, the excitation light beam 50 may penetrate the dichroic unit 220 to be incident onto the wavelength conversion module 100.

Referring to FIG. 1, in the embodiment, the wavelength conversion module 100 is located on the transmission path of the excitation light beam 50. Referring to FIG. 2A to FIG. 2B, in the embodiment, the wavelength conversion module 100 includes at least one wavelength conversion region WR and an optical region (which is illustrated as TR in FIG. 2A) which may allow a light beam irradiating thereon to penetrate. However, in other embodiments, the optical region TR may reflect the excitation light beam. For instance, referring to FIG. 1 to FIG. 2B, the at least one wavelength conversion region WR of the wavelength conversion module 100 is configured to convert the excitation light beam 50 into at least one wavelength conversion beam 60, and the light transmissive region TR of the wavelength conversion module 100 is configured to allow the excitation light beam 50 to pass through so that it may be transmitted to a subsequent optical component.

More specifically, as illustrated in FIG. 2A to FIG. 2C, the wavelength conversion module 100 includes a substrate 110 and a wavelength conversion layer 120. The substrate 110 has an axial center O located at the center of the substrate 110. The wavelength conversion layer 120 is located on the substrate 110, is disposed corresponding to the at least one wavelength conversion region WR and includes a wavelength conversion material WM, a bonding material BM and a plurality of diffuse reflection particles RM. For example, in the embodiment, a material of the substrate 110 may be aluminum, and the diffuse reflection particles RM may be white scattering particles such as titanium dioxide ($TiO_2$), silicon dioxide ($SiO_2$), aluminum oxide ($Al_2O_3$), boron nitride (BN) or zirconium dioxide ($ZrO_2$), but the invention is not limited thereto. The bonding material BM may be, for example, organic glue or inorganic glue, such as silica gel.

Furthermore, referring to FIG. 2C, in the embodiment, the substrate 110 has a rough surface R110. The rough surface R110 includes two first regions R111 and a second region R112. The second region R112 is located between the two first regions R111 in a radial direction R on the substrate 110. The wavelength conversion material WM is distributed in the bonding material BM, and the wavelength conversion material WM, for example, may be used to absorb the blue laser beam and emit a conversion beam with a different color wavelength from that of the blue laser beam. For example, the wavelength conversion material may be phosphor particles which are excited to emit a color light. The diffuse reflection particles RM are located on the rough surface R110 of the substrate 110 and located between the wavelength conversion material WM and the substrate 110.

Specifically, referring to FIG. 2C, in the embodiment, a second density of the diffuse reflection particles RM in the second region R112 is greater than a first density of the diffuse reflection particles RM in one of the first regions R111. For example, in the embodiment, the second or first density of the diffuse reflection particles RM refers to a concentration percentage by volume of the diffuse reflection particles RM, and a second concentration percentage by volume of the diffuse reflection particles in the second region R112 ranges from 60% to 100%. In other words, referring to FIG. 2C, in the embodiment, second particle gaps between the diffuse reflection particles RM in the second region R112 are smaller than first particle gaps between the diffuse reflection particles RM in one of the two first regions R111. In this way, when irradiating onto the second region R112 of the wavelength conversion module 100, the excitation light beam 50 may be more subjected to be reflected, such that the wavelength conversion module 100 may have a preferable reflectivity. In this way, since the second density of the diffuse reflection particles RM in the second region R112 is greater than the first density of the diffuse reflection particles RM in one of the first regions R111, the bonding material BM in the second region R112 may be less, such that risks of degradation and/or burnout caused from the poor high-temperature resistance of the bonding material BM may be avoided. Thus, the wavelength conversion layer 120 located within the second region R112 is capable of bearing a greater laser energy.

Furthermore, referring to FIG. 2C, in the embodiment, a second surface roughness (Ra) of the second region R112 of the rough surface R110 may be greater than a first surface roughness of one of the two first regions R111. For example, a second maximum height of profile (Ry) of the second region R112 may be greater than a first maximum height of profile of one of the two first regions R111. For example, in the embodiment, the second surface roughness (Ra) of the second region R112 of the rough surface R110 ranges from 10 μm to 100 μm. The maximum height of profile (Ry) of the second region R112 is approximately less than 0.1 mm. It should be noted that the values mentioned are used only for examples and are not intended to limit the invention. Moreover, the second surface roughness (Ra) of the second region R112 of the rough surface R110 may be less than or equal to the first surface roughness of one of the two first regions R111, and the first surface roughness of one of the two first regions R111 may be the same or different, but the invention is not limited thereto. Two first regions R111 may be smoother. Selectively, at least one of the first regions R111 may be a rough surface, such that in the embodiment, a preferable bonding force may be provided between the wavelength conversion material WM and the bonding material BM coated in the two first regions R111 of the heat dissipation substrate 110, so as to improve the reliability of the wavelength conversion module 100. However, the invention is not limited thereto.

In the embodiment, the wavelength conversion module 100 further includes an oxide ceramic layer 140 located on the rough surface R110 of the substrate 110. For example, in the embodiment, a material of the oxide ceramic layer 140 may include aluminum oxide or titanium oxide, which may diffusively reflect the light. Furthermore, referring to FIG. 2C, in the embodiment, the oxide ceramic layer 140 and the diffuse reflection particles RM jointly form a reflective layer RL, and the reflective layer RL includes two first reflective regions R121 and a second reflective region R122. The two first reflective regions R121 are respectively located across the two first regions R111. The second reflective region R122 is located across the second region R112, and a first thickness of one of the first reflective regions R121 is less than a second thickness of the second reflective region R122. For example, in the embodiment, the first thickness of one of the first reflective regions R121 is less than 0.05 mm, and the second thickness of the second reflective region R122 ranges from 0.02 mm to 0.15 mm. It should be noted that the values mentioned are used only for examples and are not intended to limit the invention.

As such, referring to FIG. 1 and FIG. 2C, in the embodiment, when the excitation light beam 50 is transmitted to the wavelength conversion module 100, the excitation light beam 50 may form a spot SP on the wavelength conversion module 100, and when the excitation light beam 50 irradiates onto the wavelength conversion module 100, the excitation light beam 50 is reflected by the reflective layer RL, such that the wavelength conversion module 100 may have a preferable reflectivity. Additionally, referring to FIG. 2C, in the embodiment, since the wavelength conversion layer 120 located in the second region R112 is capable of bearing a greater laser energy, locations of the first regions R111 and the second region 112 on the wavelength conversion module 100 and the ratios of their widths may be configured based on the energy distribution of the spot SP, such that the energy density of the part of the spot SP irradiating on the second region R112 is greater than the energy density of another part of the spot SP irradiating on one of the first regions R111. In this way, by arranging the laser spot SP mostly on a region which includes more diffuse reflection particles and less bonding material BM, the risk of degradation and/or burnout caused from the bonding material which may be less heat-resistive may be avoided, so as to achieve a preferable optical quality and reliability.

In the embodiment, with different densities configured for different regions of the rough surface R110 of the substrate 110 of the wavelength conversion module 100, the reflectivity, heat resistance, reliability and cost of the wavelength conversion layer 120 may be maintained. Meanwhile, with different surface roughness configured for different regions of the rough surface R110 of the substrate 110 of the wavelength conversion module 100, the wavelength conversion layer 120 of the wavelength conversion module 100 may have a preferable attachment to the substrate 110. As such, the reflectivity, thermal conductivity and the conversion efficiency of the wavelength conversion module 100 may be improved, while maintaining a preferable reliability and low cost.

On the other hand, referring to FIG. 2A to FIG. 2B, in the embodiment, the optical region (which is illustrated as TR in FIG. 2A) of the wavelength conversion module 100 may include a hollow region (which is not illustrated) and a diffuser 130 disposed corresponding to the hollow region. The diffuser 130 is configured to diffuse the excitation light beam to form a diffused light beam, thereby mitigating laser speckles caused from the excitation light beam 50. Namely, in the embodiment, the wavelength conversion module 100 is a transmissive wavelength conversion module 100, and the optical region (which is illustrated as TR in FIG. 2A) is configured to allow the excitation light beam 50 to penetrate. However, the invention is not limited thereto, and in other embodiments, the optical region may be a light reflective region.

Thus, referring to FIG. 1 and FIG. 2A to FIG. 2B, in the embodiment, the wavelength conversion module 100 further includes a first driving device MR configured to drive the optical region (which is illustrated as TR in FIG. 2A) and the at least one wavelength conversion region WR to enter an irradiation range of the excitation light beam 50 at different times, such that the excitation light beam 50 may, for example, selectively pass through or may be converted into the wavelength conversion beam 60. Referring to FIG. 1, in the embodiment, for example, when the optical region (which is illustrated as TR in FIG. 2A) of the wavelength conversion module 100 enters the irradiation range of the excitation light beam 50, the excitation light beam 50 may penetrate the wavelength conversion module 100 and be transmitted to a light filter module 230 by a light transmission module LT, but the invention is not limited thereto. On the other hand, in the embodiment, when the at least one wavelength conversion region WR enters the irradiation range of the excitation light beam 50, the excitation light beam 50 is converted into the at least one wavelength conversion beam 60 by the at least one wavelength conversion region WR. Afterwards, as illustrated in FIG. 1, at least one wavelength conversion beam 60 from the wavelength conversion module 100 may be guided to the dichroic unit 220 and reflected towards the subsequent light filter module 230.

Specifically, as illustrated in FIG. 1, the projection apparatus 200 further includes the light filter module 230 described above. The light filter module 230 is located on the transmission paths of the excitation light beam 50 and the wavelength conversion beam 60 and includes a light filter region (not shown) and a light transparent region (not shown). The light filter module 230 further includes a second driving device (not shown) configured to drive the light filter region (not shown) to enter an irradiation range of the wavelength conversion beam 60 at different times, thereby forming a red color light beam and a red color light beam and a green color light beam. On the other hand, the light transparent region (not shown) may also enter the irradiation range of the excitation light beam 50 which is transmitted to the light filter module 230 at different times, thereby forming a blue color light beam. In this way, the excitation light beam 50 and the wavelength conversion beam 60 are time-sequentially converted into an illumination beam 70 having various color wavelengths.

On the other hand, referring to FIG. 1, in the embodiment, the projection apparatus 200 further includes a light-homogenizing component 240 located on a transmission path of the illumination beam 70. In the embodiment, the light-homogenizing component 240 includes an integrator, but the invention is not limited thereto. In detail, as illustrated in FIG. 1, when the illumination beam 70 is transmitted to the light-homogenizing component 240 by an illumination system, the light-homogenizing component 240 may homogenize the illumination beam 70 and transmit it to the light valve 250.

Then, as illustrated in FIG. 1, the light valve 250 is located on the transmittance path of the illumination beam 70 and configured to convert the illumination beam 70 into an image beam 80. The projection lens 260 is located on a transmission path of the image beam 80 and configured to project the image beam 80, thereby projecting the image beam 80 onto a screen (not shown) to form an image. After the illumination beam 70 is converged on the light valve 250, the light valve 250 sequentially converts the illumination beam 70 into an image beam 80 having different color wavelengths and then the image beam 80 is transmitted to the projection lens 260. Therefore, a colorful image may be formed by the image beam 80 from the light valve 250.

Figure 3:
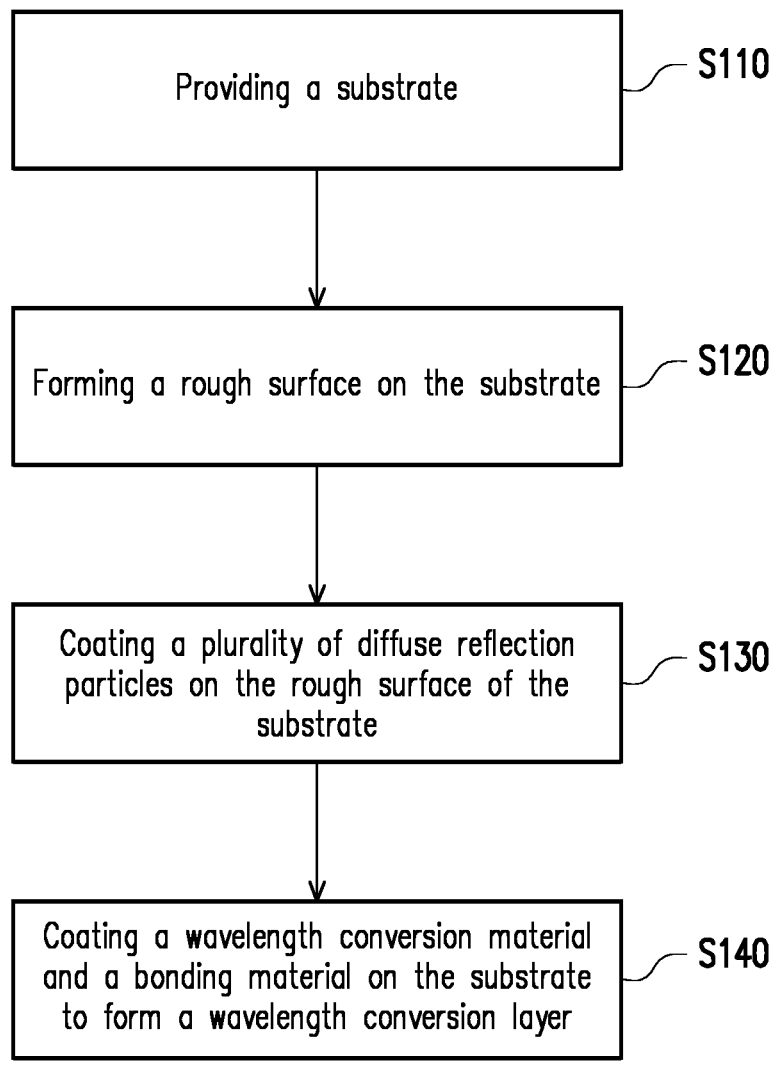
FIG. 3 is a method of forming a wavelength conversion module according to an embodiment of the invention.
Figure 4A:
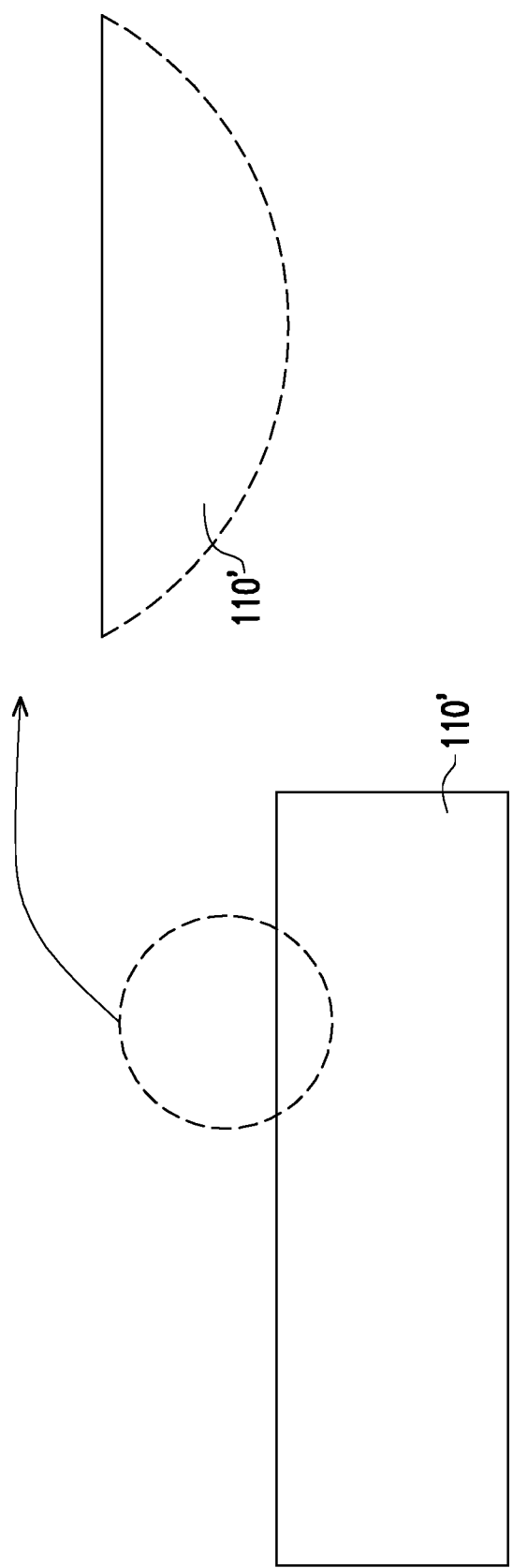
FIG. 4A to FIG. 4D are schematic views illustrating a manufacturing process of a wavelength conversion module according to an embodiment of the invention.
Figure 4B:
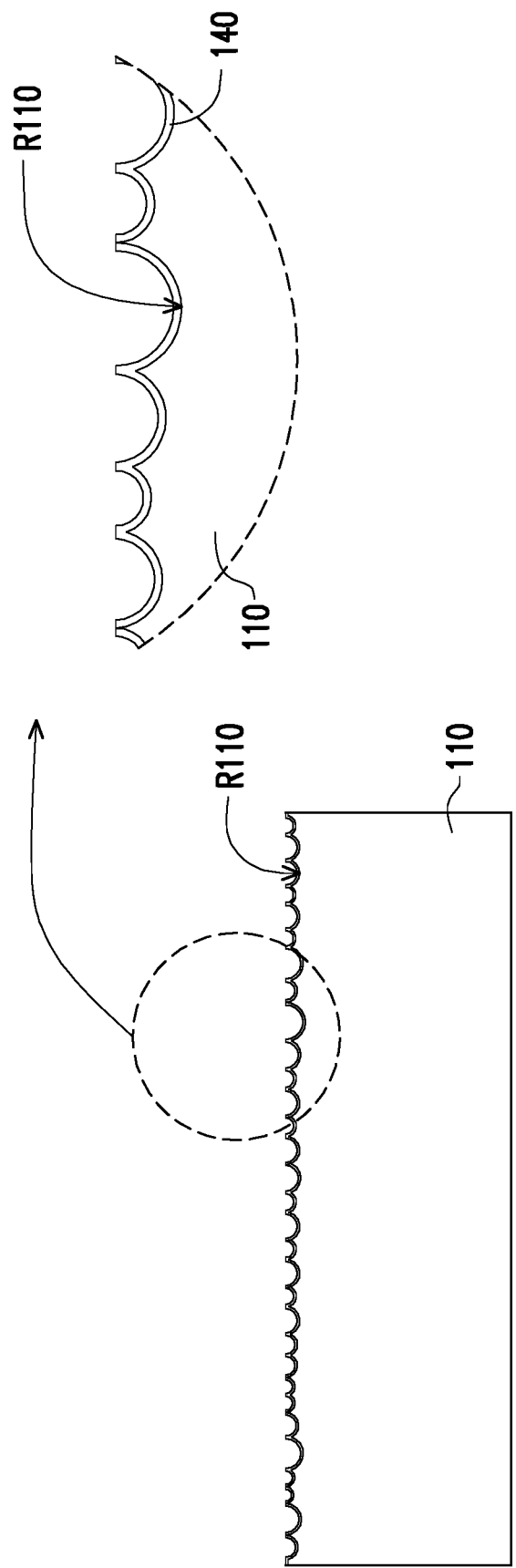

FIG. 3 is a method of forming a wavelength conversion module according to an embodiment of the invention. FIG. 4A to FIG. 4D are schematic views illustrating a manufacturing process of a wavelength conversion module according to an embodiment of the invention. Referring to FIG. 3 and FIG. 4A first, in step S110, a substrate 110' is provided. Then, referring to FIG. 3 and FIG. 4B, in step 120, a rough surface R110 is formed on the substrate 110'. For example, of the step 120 of forming the rough surface R110 on the substrate 110' includes a chemical etching, a sandblasting, a grinding or a plasma electrolytic oxidation (PEO) process. Specifically, in an explanative PEO process, in step S120, the substrate 110 may be placed in a plating solution, and a high-voltage arc may be caused above the surface of the substrate 110 to change the surface structure, so as to form the rough surface R110. Additionally, the rough surface R110 formed by this process may have an oxide ceramic layer 140 thereon. In this way, a substrate 110 as illustrated in FIG. 4B may be formed.

Figure 4C:
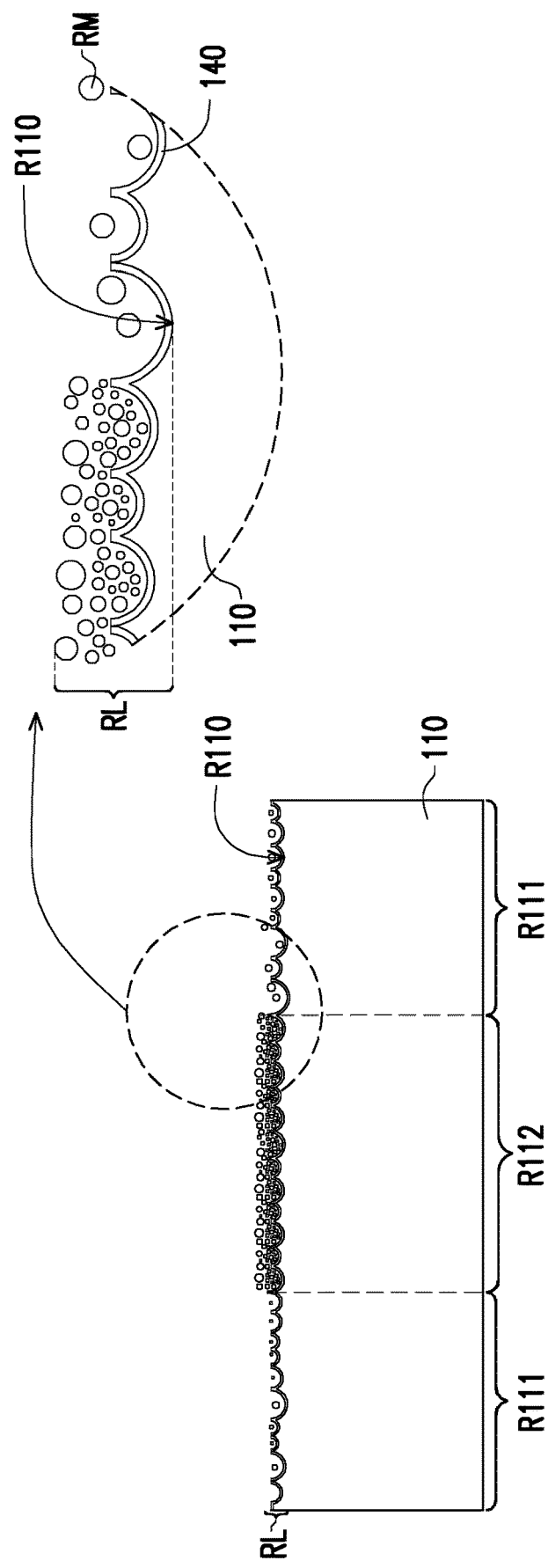

Then, referring to FIG. 3 and FIG. 4C, in step S130, a plurality of diffuse reflection particles RM are coated on the rough surface R110 of the substrate 110. The second concentration percentage by volume of the diffuse reflection particles RM in a second region R112 is greater than or equal to the first concentration percentage by volume of the diffuse reflection particles RM in each first region R111. For example, in the embodiment, of the step of coating the diffuse reflection particles RM on the rough surface R110 of the substrate 110 includes: mixing the diffuse reflection particles RM into alcohol or other dispersing solvents; and then coating the mixture onto the rough surface R110 of the substrate 110 by a dispensing, spray-on or a printing process.

More particularly, in the embodiment, when the diffuse reflection particles RM are coated by a printing process, a screen used during the printing process may be so designed that an area corresponding to the second region R112 of the rough surface R112 may have greater pores and that another area corresponding to the two first regions R111 of the rough surface R110 may have smaller pores, such that a second density of the diffuse reflection particles RM in the second region R112 is greater than a first density of the diffuse reflection particles RM in one of the first regions R111. On the other hand, in a dispensing process, when the diffuse reflection particles RM are coated, a dispensing route may be so designed that an area corresponding to the second region R112 of the rough surface R110 may be dispensed with a slow coating speed and that another area corresponding to one of the two first regions R111 of the rough surface R110 may be dispensed with a fast coating speed, such that the second density of the diffuse reflection particles RM in the second region R112 is greater than a first density of the diffuse reflection particles RM in one of the first regions R111. In addition, in a spray-on process, the diffuse reflection particles RM may be coated, and a spray-on fixture may be designed with such a shield that a second density of the diffuse reflection particles RM in the second region R112 is greater than a first density of the diffuse reflection particles RM in one of the first regions R111. In this way, after step S130 is completed, the diffuse reflection particles RM with different concentrations and/or different thicknesses are coated on the rough surface R110 of the substrate 110 to form a reflective layer RL.

Figure 4D:
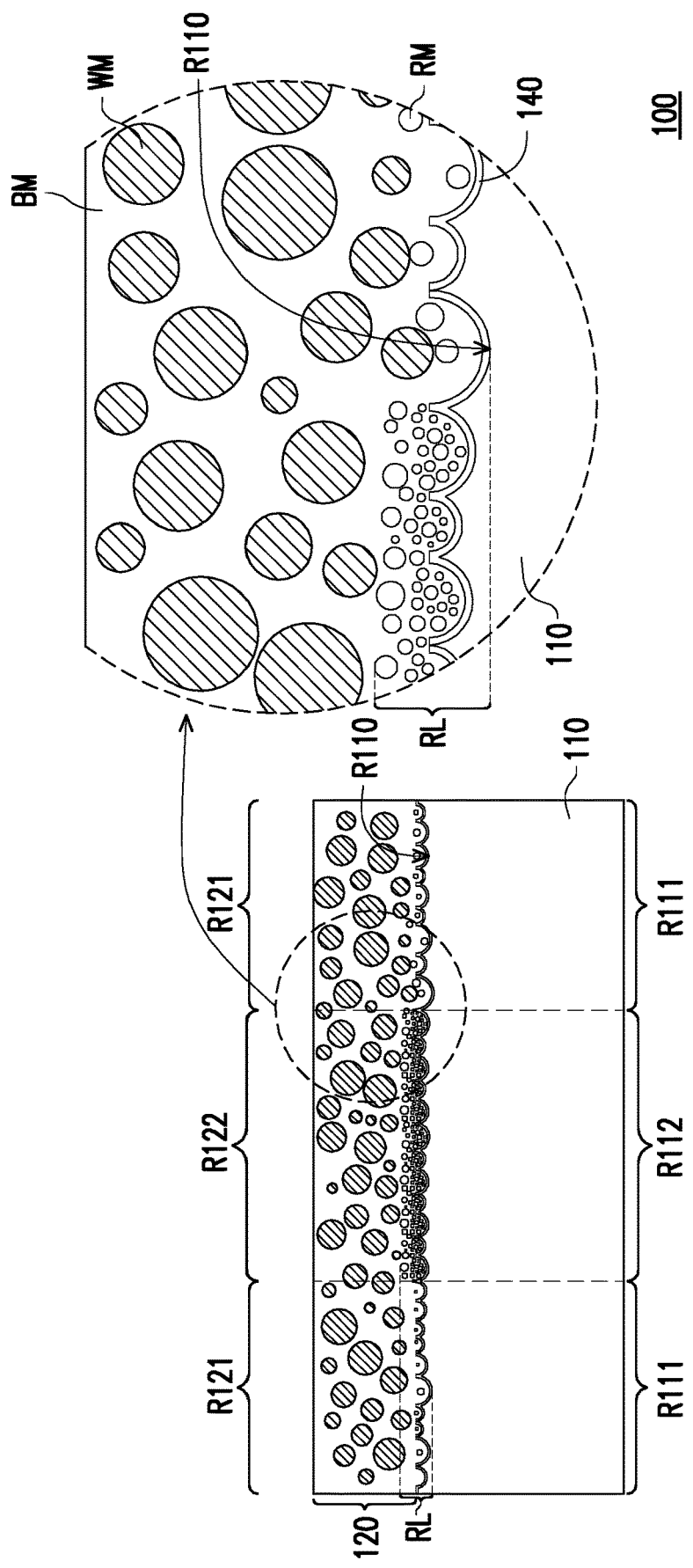

Then, referring to FIG. 3 and FIG. 4D, in step S140, a wavelength conversion material WM and a bonding material BM are coated on the substrate 110 to form a wavelength conversion layer 120, and the diffuse reflection particles RM are located between the wavelength conversion material WM and the substrate 110. For instance, referring to FIG. 4D, in the embodiment, of the step of forming the wavelength conversion layer 120 includes: forming a mixture of the wavelength conversion material WM and the bonding material BM; and coating the mixture on the substrate 110. Thereafter, the wavelength conversion material WM and the bonding material BM are cured. In this way, a structure of the wavelength conversion module 100 as illustrated in FIG. 2A to FIG. 2C is formed.

Figure 5A:
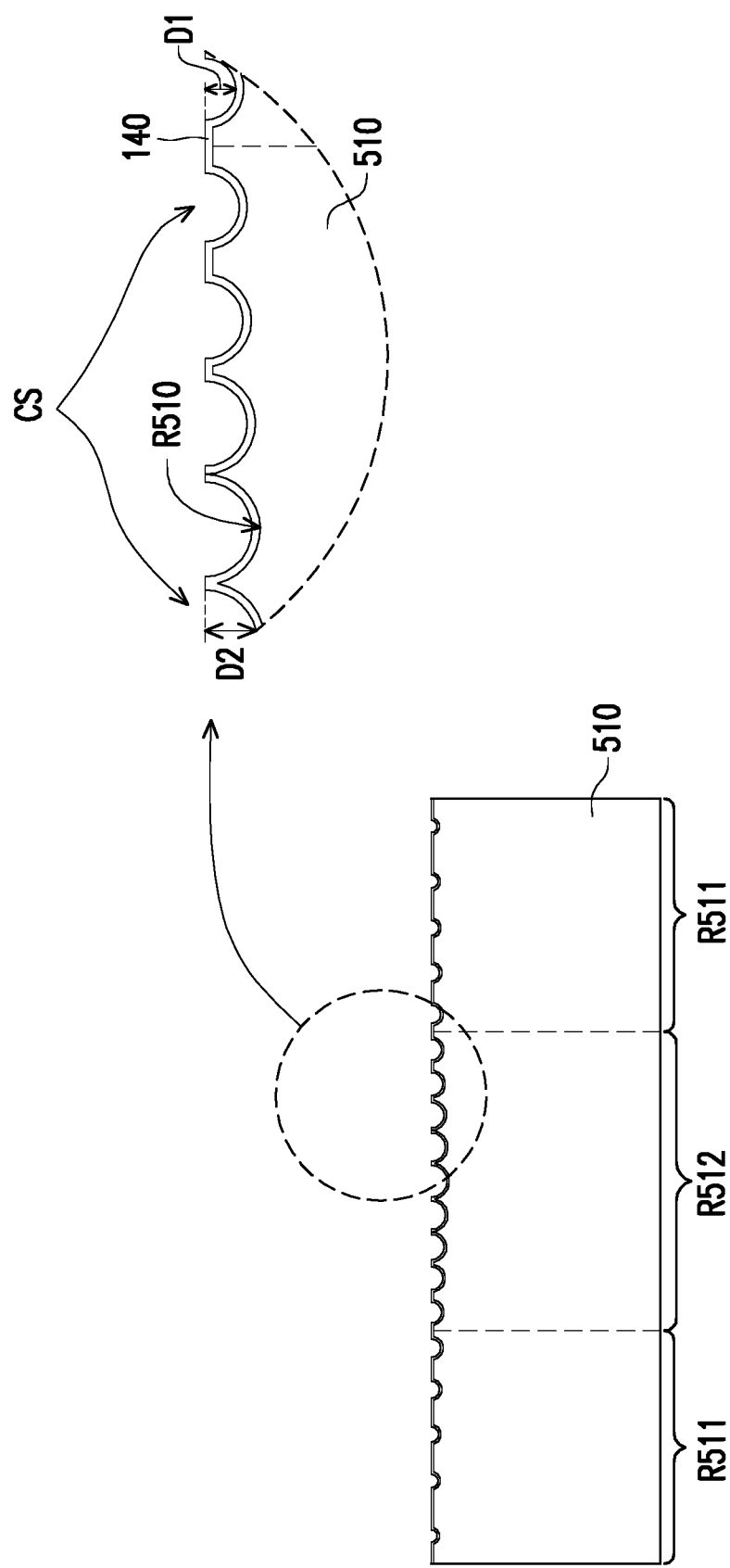
FIG. 5A to FIG. 5C are schematic views illustrating a manufacturing process of a wavelength conversion module according to another embodiment of the invention.
Figure 5B:
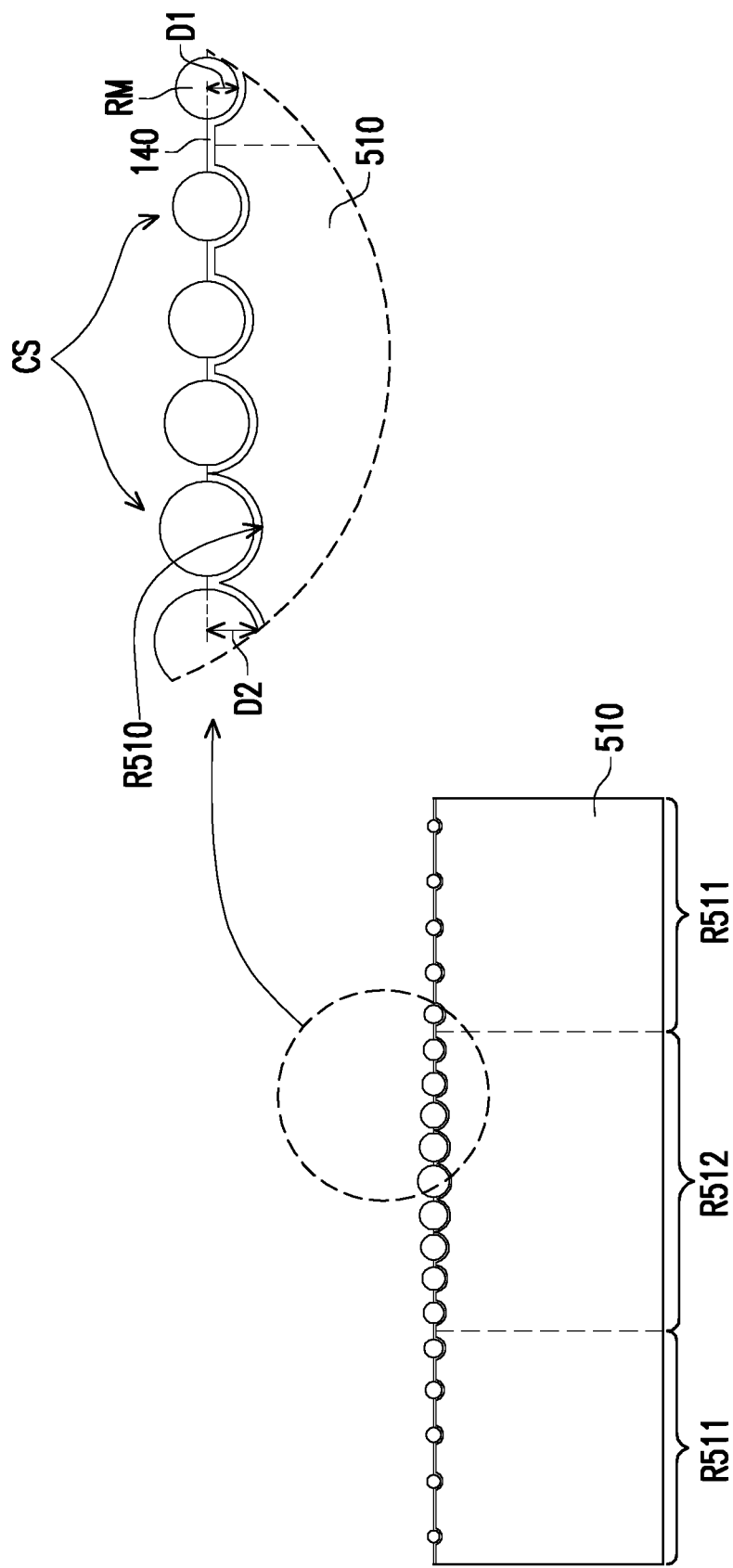
Figure 5C:
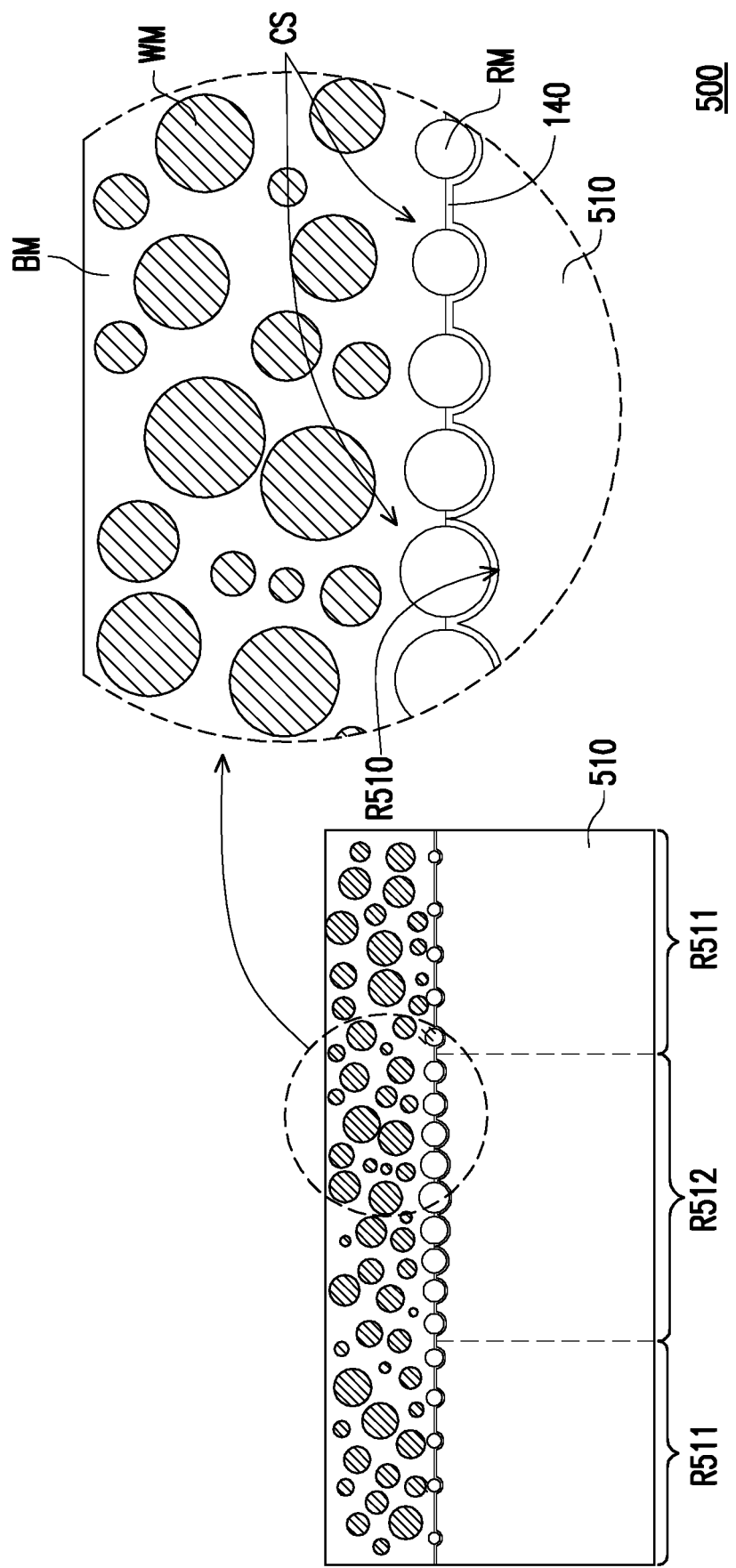

FIG. 5A to FIG. 5C are schematic views illustrating a manufacturing process of a wavelength conversion module according to another embodiment of the invention. A manufacturing process as illustrated in FIG. 5A to FIG. 5C is similar to the manufacturing process as illustrated in the schematic views of FIG. 4B to FIG. 4D, the wavelength conversion module may be formed by the method illustrated in FIG. 3, and the difference therebetween will be described below.

Referring to FIG. 5A, in the embodiment, a rough surface R510 of a substrate 510 includes a plurality of concave-convex structures CS. Furthermore, in the embodiment, the concave-convex structures CS distributed in two first regions R511 have a first average depth D1, the concave-convex structures CS distributed in a second region R512 has a second average depth D2, and the second average depth D2 is greater than or equal to the first average depth D1. For example, in the embodiment, the second average depth D2 is less than 0.1 mm. It should be noted that the values mentioned are used only for examples and are not intended to limit the invention.

In this way, as illustrated in FIG. 5A to FIG. 5C, after steps S120 and S130 are completed, a second density of diffuse reflection particles RM in the second region R512 is greater than a first density of the diffuse reflection particles RM in one of the first regions R511, thereby forming a wavelength conversion module 500 as illustrated in FIG. 5C. Since the wavelength conversion module 500 illustrated in FIG. 5C is similar to the wavelength conversion module 100 illustrated in FIG. 2C, the same function may be achieved, and the wavelength conversion module 500 may achieve an effect and advantage similar to those aforementioned about wavelength conversion module 100, which may be not repeated. Additionally, when the wavelength conversion module 500 is applied to the projection apparatus 200 described above, the projection apparatus 200 may achieve the similar effect and advantage which will not be repeatedly described.

In the embodiment illustrated in FIG. 1, the projection apparatus 200 including the transmissive wavelength conversion module 100 is taken as an example for illustration, but the invention is not limited thereto. In other embodiments, the projection apparatus 200 may also include a reflective wavelength conversion module. One with ordinary skill in the art may adaptively change the optical paths with reference to the invention, so as to achieve an effect and an advantage similar to those of the projection apparatus 200 described above, and the change may still belong to the scope of the invention. Embodiments are provided below for description.

Figure 6:
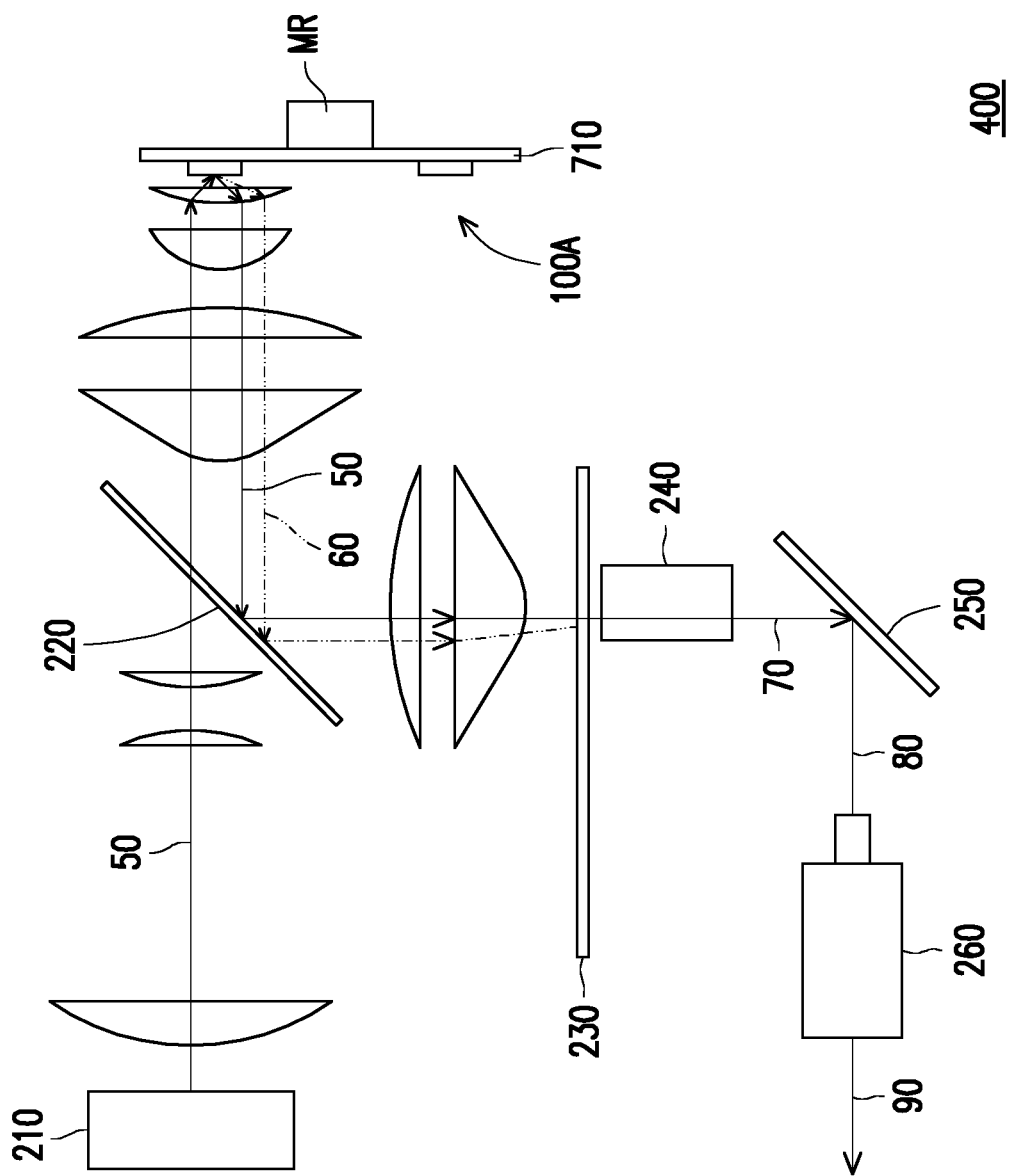
FIG. 6 is a schematic structure view of a projection apparatus according to another embodiment of the invention.

FIG. 6 is a schematic structure view of a projection apparatus according to another embodiment of the invention. In the embodiment, a projection apparatus 400 includes a wavelength conversion module 100A, the wavelength conversion module 100A is a reflective wavelength conversion module, and the wavelength conversion module 100A is similar to the wavelength conversion modules 100 and 500. The difference therebetween lies in that a substrate 110 of the wavelength conversion module 100A does not have a hollow region and thus the wavelength conversion module 100A includes a complete circular substrate 710. In other words, in an optical region (which is illustrated as TR in FIG. 2A) of the wavelength conversion module 100A, a reflective region is disposed instead of the optical region (which is illustrated as TR in FIG. 2A) of the wavelength conversion module 100 or 500, so as to reflect the excitation light beam 50.

Specifically, referring to FIG. 6, in the embodiment, when the reflective region of the wavelength conversion module 100A enters an irradiation range of the excitation light beam 50, the excitation light beam 50 may be reflected by the wavelength conversion module 100A, and then, the excitation light beam 50 from the wavelength conversion module 100A may be guided to the dichroic unit 220 and reflected to a subsequent light filter module 230. In the embodiment, when at least one wavelength conversion region WR enters the irradiation range of the excitation light beam 50, the excitation light beam 50 is converted into at least one wavelength conversion beam 60 by the at least one wavelength conversion region WR. Afterwards, as illustrated in FIG. 6, the at least one excitation light beam 60 from the wavelength conversion module 100A may be guided to the dichroic unit 220 and reflected to a subsequent light filter module 230. Thereafter, a light filter region (not shown) of the light filter module 230 enters the irradiation range of the wavelength conversion beam 60 at different times, thereby forming, for example, a red color light beam and/or a green color light beam. A light transparent region (not shown) of the light filter module 230 may also enter the irradiation range of the excitation light beam 50 which is transmitted to the light filter module 230 at different times, thereby forming a blue color light beam. Accordingly, an illumination beam 70 and an image beam 80 may be formed.

In this way, the wavelength conversion module 100A used in a projection apparatus 400 is similar to the wavelength conversion module 500 illustrated in FIG. 5C or the wavelength conversion module 100 illustrated in FIG. 2C, so as to achieve the same function, and thus, the projection apparatus 400 may achieve an effect and an advantage similar to those of the projection apparatus 200 described above.

Figure 7:
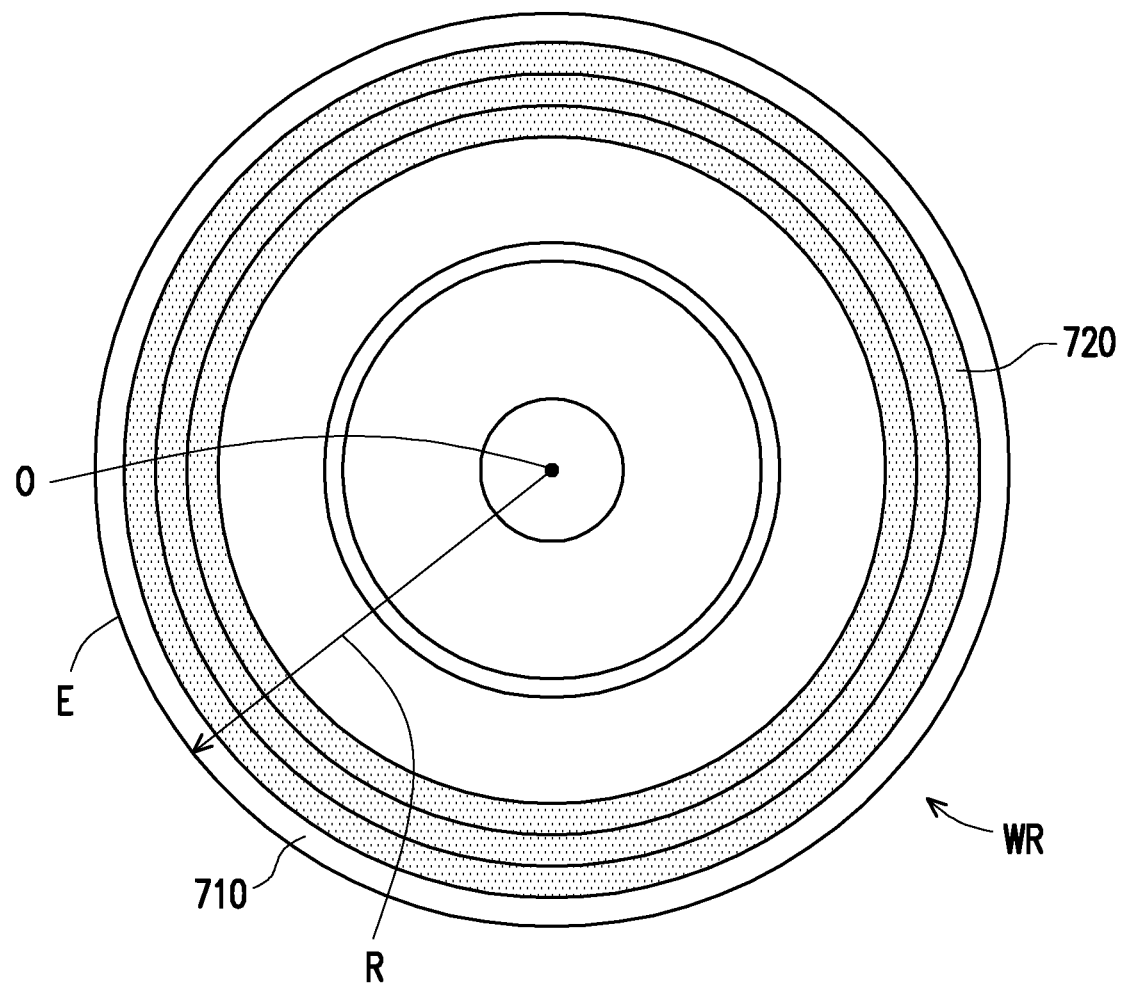
FIG. 7 is a schematic top view of the wavelength conversion module depicted in FIG. 6.

FIG. 7 is a schematic top view of the wavelength conversion module depicted in FIG. 6. A wavelength conversion module 700 illustrated in FIG. 7 is similar to the wavelength conversion module 100 illustrated in FIG. 2C, and the difference therebetween will be set forth as below. A substrate 710 of the wavelength conversion module 700 does not have a hollow region and may include a complete circular substrate 110 (or 710). In other words, an optical region (which is illustrated as TR in FIG. 2A) of the wavelength conversion module 700 may also be a reflective region or any other optical region. In addition, a wavelength conversion layer 720 of the wavelength conversion module 700 may have a ring-shaped contour, and a spot SP formed by the excitation light beam 50 may be located on both the wavelength conversion layer 720 and the periphery surrounding the wavelength conversion layer 720. Specifically, a diffuser 130 may be disposed at the periphery surrounding the wavelength conversion layer 720, such that when the excitation light beam 50 passes through the diffuser 130, a desirable blue light beam may be formed and a laser speckle phenomenon may be avoided. The beam may be further transmitted to other optical components, so as to be applied to the projection apparatus 400.

Since the wavelength conversion module 700 illustrated in FIG. 7 is similar to the wavelength conversion module 500 illustrated in FIG. 5C or the wavelength conversion module 100 illustrated in FIG. 2C, the same function may be achieved, and the wavelength conversion module 700 may achieve an effect and advantage similar to those aforementioned about wavelength conversion module 100, which will not be repeatedly described. Additionally, when the wavelength conversion module 700 is applied to the projection apparatus 400 described above, the projection apparatus 400 may achieve the similar effect and advantage, which will not be repeatedly described.

Based on the above, the embodiments of the invention achieve at least one of the following advantages or effects. In the embodiments of the invention, various distribution densities of the diffuse reflection particles in different regions on the substrate may be achieved by disposing a rough surface on the substrate of the wavelength conversion module. Due to such-distributed diffuse reflection particles which are used for forming a wavelength conversion layer, a preferable combination of reflectivity, heat resistance, reliability, and manufacture cost of the wavelength conversion layer may be thus achieved. Further, by configuring the surface roughnesses of the two first regions and the second region of the rough surface as required by the wavelength conversion module, the wavelength conversion layer of the wavelength conversion module may have a preferable conversion efficiency and a preferable attachment with the substrate. As such, the reliability of the wavelength conversion module may be improved. On the other hand, in the projection apparatus of the embodiments of the invention, main part of the laser spot may be directed at an area with more diffuse reflection particles and less bonding material. Thus, the risk of degradation and/or burnout caused from the bonding material which may be less heat-resistive may be avoided. Therefore, a preferable optical quality and reliability may be arrived at. In addition, in the method of forming the wavelength conversion module provided in the embodiments of the invention, various densities of the diffuse reflection particles used for the wavelength conversion layer in different areas of the substrate may be controlled by forming a rough surface on the substrate, such that the wavelength conversion module can have a preferable reliability and conversion efficiency.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A wavelength conversion module, comprising:
   a substrate, having a rough surface comprising two first regions and a second region, wherein the second region is located between the two first regions in a radial direction on the substrate; and
   a wavelength conversion layer, located on the substrate and comprising a wavelength conversion material, a bonding material and a plurality of diffuse reflection particles,
   wherein the wavelength conversion material is distributed in the bonding material, the plurality of diffuse reflection particles are located on the rough surface of the substrate, and the plurality of diffuse reflection particles are located between the wavelength conversion material and the substrate, and
   wherein a second density of the plurality of diffuse reflection particles in the second region is greater than a first density of the plurality of diffuse reflection particles in one of the two first regions.

2. The wavelength conversion module according to claim 1, wherein the second density or the first density of the plurality of diffuse reflection particles refers to a concentration percentage by volume of the plurality of diffuse reflection particles, and a second concentration percentage by volume of the plurality of diffuse reflection particles in the second region ranges from 60% to 100%.

3. The wavelength conversion module according to claim 1, wherein a second surface roughness of the second region is greater than a first surface roughness of one of the two first regions.

4. The wavelength conversion module according to claim 1, wherein a second surface roughness of the second region is less than or equal to a first surface roughness of one of the two first regions.

5. The wavelength conversion module according to claim 1, wherein a second surface roughness of the second region ranges from 10 μm to 100 μm.

6. The wavelength conversion module according to claim 1, wherein second particle gaps between the plurality of diffuse reflection particles in the second region are smaller than second particle gaps between the plurality of diffuse reflection particles in one of the two first regions.

7. The wavelength conversion module according to claim 1, wherein the rough surface of the substrate comprises a plurality of concave-convex structures.

8. The wavelength conversion module according to claim 7, wherein a second average depth of the plurality of concave-convex structures distributed in the second region is greater than or equal to a first average depth of the plurality of concave-convex structures distributed in one of the two first regions.

9. The wavelength conversion module according to claim 1, further comprising:
   an oxide ceramic layer, located on the rough surface of the substrate.

10. The wavelength conversion module according to claim 9, wherein the oxide ceramic layer and the plurality of diffuse reflection particles jointly form a reflective layer, and the reflective layer comprises:
    two first reflective regions, respectively located across the two first regions; and
    a second reflective region, located across the second region, wherein a first thickness of one of the two first reflective regions is less than a second thickness of the second reflective region.

11. The wavelength conversion module according to claim 10, wherein the first thickness of one of the two first reflective regions is less than 0.05 mm, and the second thickness of the second reflective region ranges from 0.02 mm to 0.15 mm.

12. The wavelength conversion module according to claim 9, wherein a material of the oxide ceramic layer comprises aluminum oxide or titanium oxide.

13. A method of forming a wavelength conversion module, comprising:
    forming a rough surface on a substrate, wherein the rough surface comprises two first regions and a second region, and the second region is located between the two first regions in a radial direction on the substrate;
    coating a plurality of diffuse reflection particles on the rough surface of the substrate, wherein a second concentration percentage by volume of the plurality of diffuse reflection particles in the second region is greater than or equal to a first concentration percentage by volume of the plurality of diffuse reflection particles in one of the two first regions; and
    coating a wavelength conversion material and a bonding material on the substrate to form a wavelength conversion layer, wherein the plurality of diffuse reflection particles are located between the wavelength conversion material and the substrate.

14. The method according to claim 13, wherein a method of forming the rough surface on the substrate comprises a chemical etching, a sandblasting, a grinding or a plasma electrolytic oxidation process.

15. The method according to claim 13, wherein a method of coating the plurality of diffuse reflection particles on the rough surface of the substrate comprises a dispensing, a spray-on or a printing process.

16. A projection apparatus, comprising:
    a wavelength conversion module, comprising:
      a substrate, having a rough surface comprising two first regions and a second region, wherein the second region is located between the two first regions in a radial direction on the substrate; and
      a wavelength conversion layer, located on the substrate and comprising a wavelength conversion material, a bonding material and a plurality of diffuse reflection particles, wherein
        the wavelength conversion material is distributed in the bonding material, and the plurality of diffuse reflection particles are located on the rough surface of the substrate, and the plurality of diffuse reflection particles are located between the wavelength conversion material and the substrate, and
        wherein a second concentration percentage by volume of the plurality of diffuse reflection particles in the second region is greater than or equal to a first concentration percentage by volume of the plurality of diffuse reflection particles in one of the two first regions; and
    an excitation light source, configured to emit an excitation light beam, wherein the excitation light beam is transmitted to the wavelength conversion module and converted into an illumination beam by the wavelength conversion module;

a light valve, located on a transmission path of the illumination beam and configured to convert the illumination beam into an image beam; and a projection lens, located on a transmission path of the image beam and configured to project the illumination beam.

17. The projection apparatus according to claim 16, wherein when the excitation light beam is transmitted to the wavelength conversion module, the excitation light beam forms a spot on the wavelength conversion module, and a second energy density of a part of the spot irradiated on the second region is greater than a first energy density of another part of the spot irradiated on one of the two first regions.

18. The projection apparatus according to claim 16, wherein the second concentration percentage by volume of the plurality of diffuse reflection particles in the second region ranges from 60% to 100%.

19. The projection apparatus according to claim 16, wherein a second surface roughness of the second region is greater than a first surface roughness of one of the two first regions.

20. The projection apparatus according to claim 16, wherein a second surface roughness of the second region is less than or equal to a first surface roughness of one of the two first regions.

21. The projection apparatus according to claim 16, wherein a second surface roughness of the second region ranges from 10 μm to 100 μm.

22. The projection apparatus according to claim 16, wherein second particle gaps between the plurality of diffuse reflection particles in the second region are smaller than first particle gaps between the plurality of diffuse reflection particles in one of the two first regions.

23. The projection apparatus according to claim 16, further comprising:

an oxide ceramic layer, located on the rough surface of the substrate.

24. The projection apparatus according to claim 23, wherein a material of the oxide ceramic layer comprises aluminum oxide or titanium oxide.

* * * * *